United States Patent
Ota et al.

(10) Patent No.: US 7,242,014 B2
(45) Date of Patent: Jul. 10, 2007

(54) CHARGED PARTICLE BEAM DRAWING EQUIPMENT, METHOD OF ADJUSTING APERTURE MASK, AND METHOD OF MANUFACTURING SEMICONDUCTOR DEVICE

(75) Inventors: Takumi Ota, Kawasaki (JP); Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 11/172,996

(22) Filed: Jul. 5, 2005

(65) Prior Publication Data

US 2006/0017013 A1    Jan. 26, 2006

(30) Foreign Application Priority Data

Jul. 6, 2004    (JP)    ............... 2004-199349

(51) Int. Cl.
*H01J 37/30*    (2006.01)
*H01J 37/256*    (2006.01)

(52) U.S. Cl. ............... 250/492.2; 250/492.1; 250/492.3; 250/396 R

(58) Field of Classification Search ............ None
See application file for complete search history.

(56) References Cited

U.S. PATENT DOCUMENTS 6,137,111 A    10/2000    Yamada et al.

7,095,035 B2 *    8/2006    Nishimura ............. 250/492.22

FOREIGN PATENT DOCUMENTS

| JP | 09-259804 | 10/1997 |
|---|---|---|
| JP | 3102632 | 8/2000 |

* cited by examiner

*Primary Examiner*—Nikita Wells
(74) *Attorney, Agent, or Firm*—Finnegan, Henderson, Farabow, Garrett & Dunner, L.L.P.

(57) ABSTRACT

A charged particle beam drawing equipment includes charged particle beam source, first and second shaping aperture masks with first and second opening portions for rotation adjustment, detection section to detect charged particle beam intensity distribution in a plane parallel to the second mask, the beam being emitted from the source and passing through the opening portions, rotation angle control section to control relative rotation angle between the masks, acquisition section to acquire relative rotation angle between the masks such that deviation in relative rotation angle between the masks falls within a predetermined range based on detection results obtained by changing the relative rotation angle between the masks plural times by the control section and by detecting the beam by the detection section for each rotation angle, and instruction section to instruct the rotation angle control section such that the relative rotation angle between the masks be the acquired rotation angle.

16 Claims, 4 Drawing Sheets

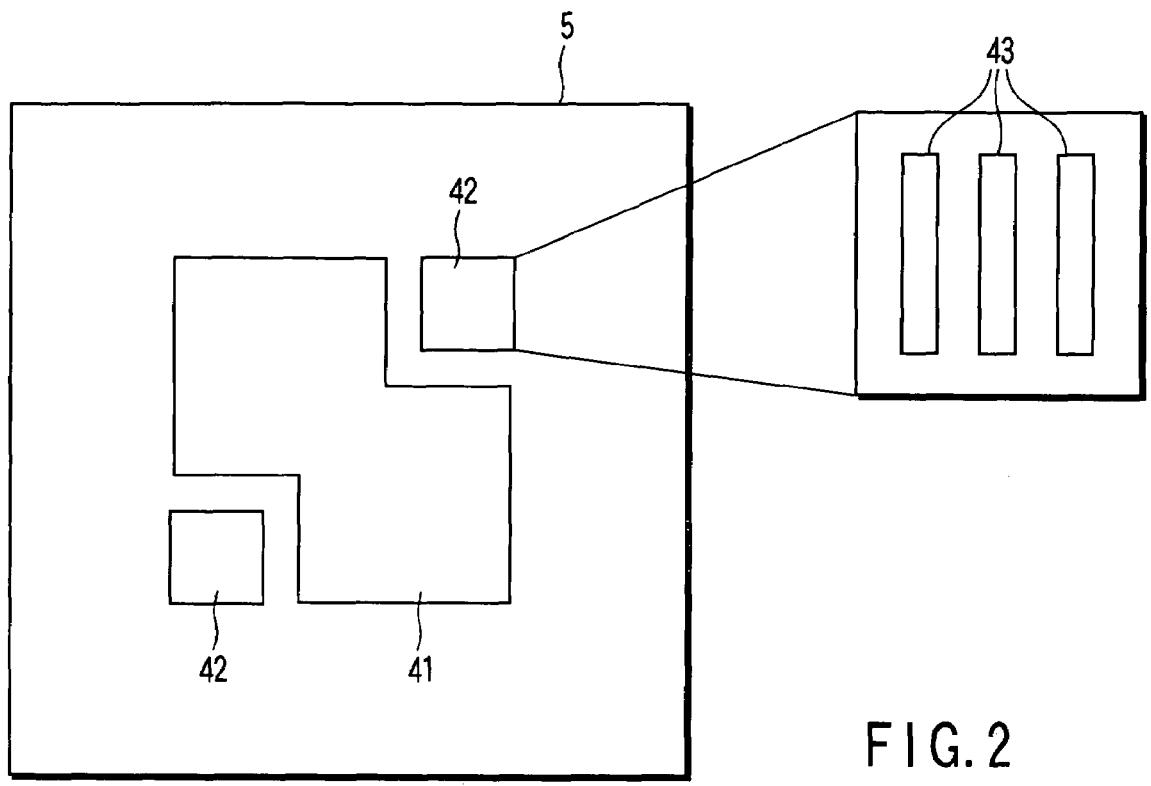
FIG. 2
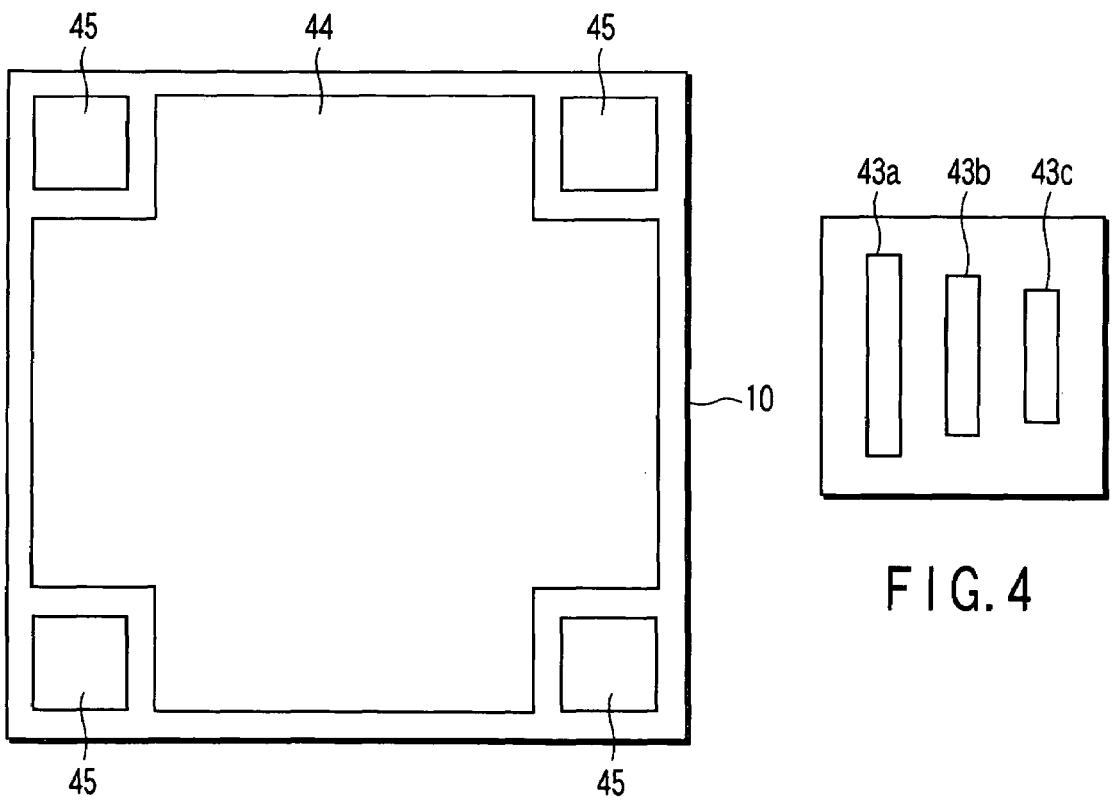
FIG. 3
FIG. 4

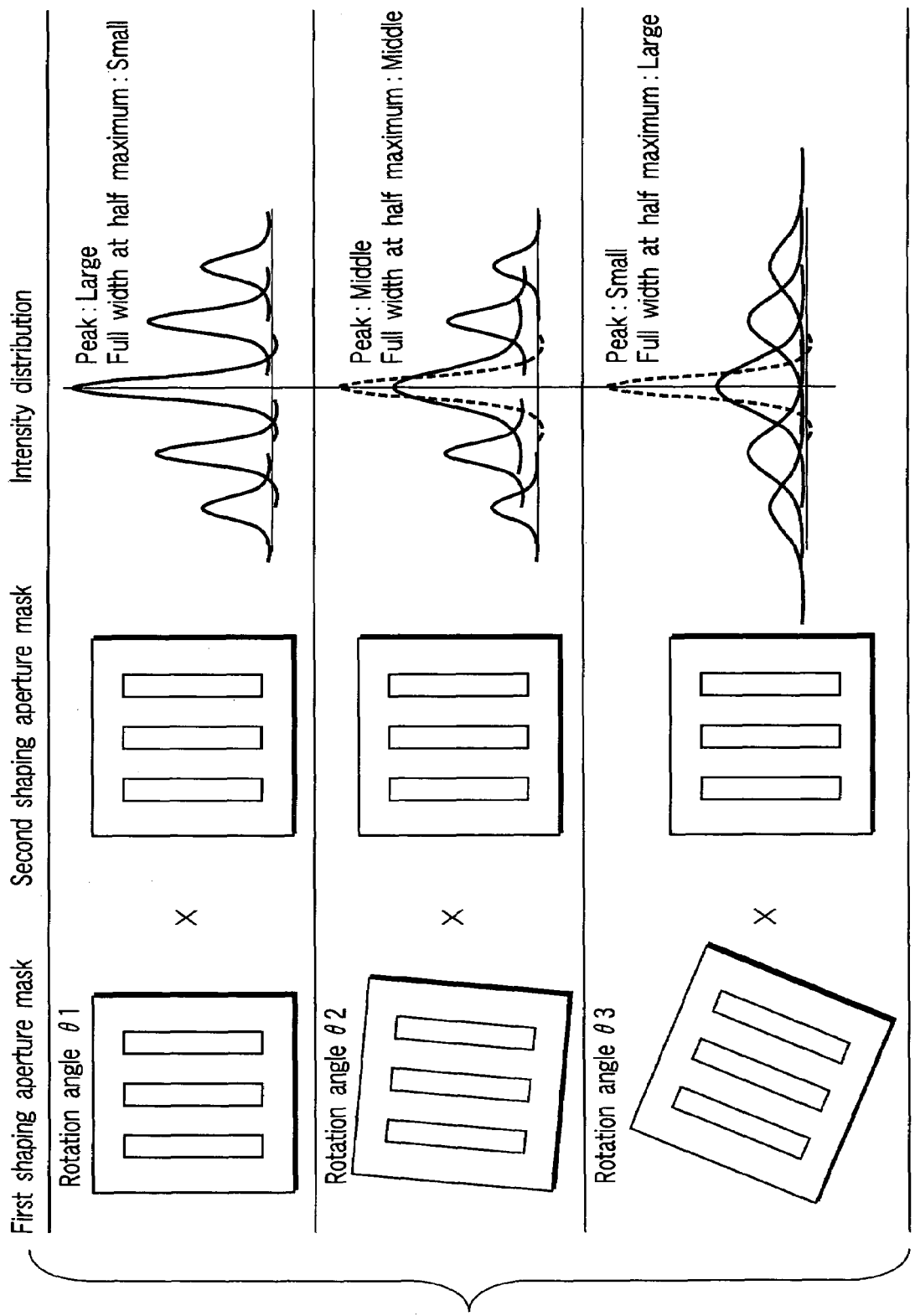
F I G. 6

CHARGED PARTICLE BEAM DRAWING EQUIPMENT, METHOD OF ADJUSTING APERTURE MASK, AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-199349, filed Jul. 6, 2004, the entire contents of which are incorporated herein by reference.

BACKGROUND OF THE INVENTION

1. Field of the Invention

The present invention relates to a charged particle beam drawing equipment for use in a lithography process, a method of adjusting an aperture mask in the drawing equipment, and a method of manufacturing a semiconductor device.

2. Description of the Related Art

With a finer and highly denser integrated circuit, there has been a demand for a charged particle beam emitting apparatus for emitting a charged particle beam or a focused ion beam which is capable of making stable operation as a semiconductor device mass-production device, achieving high throughput, and achieving finer processing capability.

In recent years, a technique for mass-production has been developed for a charged particle beam drawing equipment as well. Such a technique includes a variable shaping beam (VSB) system for producing rectangular and triangular beams of arbitrary sizes by using a plurality of apertures and a cell projection exposure system having a repetition cell (CP) mounted in advance on an aperture mask. In these systems, the position and rotation precision of the aperture are reflected on drawing precision. Thus, it is important that the aperture mask is adjusted with high precision. As the adjustment time becomes longer, equipment operability is lowered. However, a shorter adjustment time is desired.

One of the conventional aperture mask adjusting methods includes a knife edge system using an edge of an opening portion of each aperture mask (Japanese Patent No. 3102632). In this system, it is mandatory that control means for scanning a charged particle beam is precisely adjusted. Thus, a time interval required for adjusting a rotation angle of an aperture mask becomes longer by a time interval required for adjusting the control means with high precision. In addition, it is necessary that the edge of the opening portion of each aperture mask is precisely formed. However, it is difficult to form the edge of the opening portion of each aperture mask with high precision. Therefore, the conventional aperture mask adjusting method cannot be simply used because it requires a long time interval or a precisely formed edge.

BRIEF SUMMARY OF THE INVENTION

According to an aspect of the present invention, there is provided a charged particle beam drawing equipment comprising: a charged particle beam source configured to emit a charged particle beam; a first shaping aperture mask provided below the charged particle beam source and comprising a plurality of opening portions which include a first opening portion for rotation adjustment; a second shaping aperture mask provided below the first shaping aperture mask and comprising a plurality of opening portions which include a second opening portion for rotation adjustment; a detection section configured to detect an intensity distribution of charged particle beam, the intensity distribution being in a plane substantially parallel to the second shaping aperture mask, the charged particle beam being emitted from the charged particle beam source and passing through the first and second opening portions for rotation adjustment; a rotation angle control section configured to control a relative rotation angle between the first shaping aperture mask and the second shaping aperture mask by rotating the first shaping aperture mask or the second shaping aperture mask; an acquisition section configured to acquire a relative rotation angle between the first shaping aperture mask and the second shaping aperture mask such that a deviation in relative rotation angle between the first shaping aperture mask and the second shaping aperture mask falls within a predetermined range on the basis of a plurality of detection results obtained by changing the relative rotation angle between the first shaping aperture mask and the second shaping aperture mask a plurality of times by the rotation angle control section and by detecting the charged particle beam by the detection section for each rotation angle; and an instruction section configured to provide an instruction to the rotation angle control section such that the relative rotation angle between the first shaping aperture mask and the second shaping aperture mask is to be the acquired rotation angle.

According to an aspect of the present invention, there is provided an aperture adjusting method for a charged particle beam drawing equipment comprising, the charged particle beam drawing equipment comprising: a charged particle beam source configured to emit a charged particle beam; a first shaping aperture mask provided below the charged particle beam source and comprising a plurality of opening portions which include a first opening portion for rotation adjustment; and a second shaping aperture mask provided below the first shaping aperture mask and comprising a plurality of opening portions which include a second opening portion for rotation adjustment, the aperture adjusting method comprising: setting a relative rotation angle between the first shaping aperture mask and the second shaping aperture mask to one of a plurality of predetermined rotation angles; causing a charged particle beam emitted from the charged particle beam source to pass through the first and second opening portions for rotation adjustment; a detecting an intensity distribution of charged particle beam, the intensity distribution being in a plane substantially parallel to the second shaping aperture mask, the charged particle beam being emitted from the charged particle beam source and passing through the first and second opening portions for rotation adjustment; with respect to a remaining rotation angle of the plurality of predetermined rotation angles, causing a charged particle beams emitted from the charged particle beam source to pass through the first and second opening portions for rotation adjustment, and detecting an intensity distribution of charged particle beam, the intensity distribution being in the plane substantially parallel to the second shaping aperture mask, the charged particle beam being emitted from the charged particle beam source and passing through the first and second opening portions for rotation adjustment; acquiring the relative rotation angle between the first shaping aperture mask and the second shaping aperture mask such that a deviation in relative rotation angle between the first shaping aperture mask and the second shaping aperture mask falls within a predetermined range on the basis of the intensity distribution of the plurality of charged particle beams detected with respect to the plurality of predetermined rotation angles; and setting the relative rotation angle between the first shaping aperture mask and the second shaping aperture mask at the acquired rotation angle.

According to an aspect of the present invention, there is provided a method of manufacturing a semiconductor device comprising: forming a resist film on a substrate including a semiconductor substrate; drawing a pattern on the substrate using a charged particle beam drawing equipment of claim 1; forming a resist pattern by developing the resist film; and forming a pattern on the substrate by etching the substrate using the resist pattern as a mask.

BRIEF DESCRIPTION OF THE SEVERAL VIEWS OF THE DRAWING

FIG. 2 is a plan view showing an example of a layout of a first shaping aperture mask;

FIG. 3 is a plan view showing an example of a layout of a second shaping aperture mask;

FIG. 4 is a plan view showing an opening pattern of an opening portion for adjustment in the first shaping aperture mask;

FIG. 6 is a view showing a signal intensity distribution detected at each rotation angle $\theta i$ ($i=1, 2, 3$) in the case where the second shaping aperture mask is fixed and the first shaping aperture mask is rotated.

DETAILED DESCRIPTION OF THE INVENTION

Hereinafter, embodiments of the present invention will be described with reference to the accompanying drawings.

Figure 1:
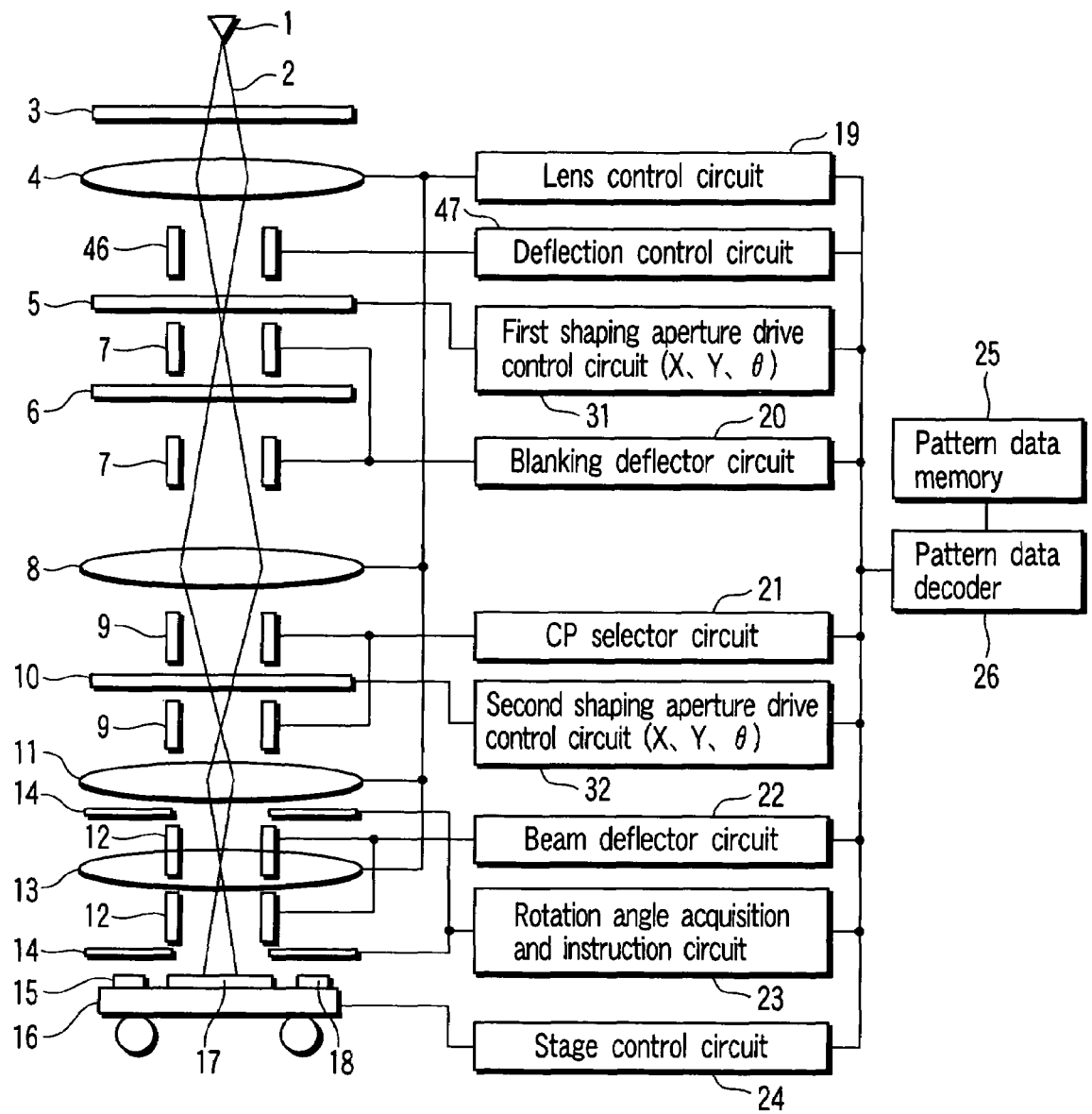
FIG. 1 is a diagram schematically depicting a general configuration of a charged particle beam drawing equipment according to an embodiment of the present invention.

FIG. 1 is a diagram schematically depicting a general configuration of a charged particle beam drawing equipment according to an embodiment of the present invention.

The charged particle beam drawing equipment according to the present embodiment primarily comprises an electron gun 1, the first shaping aperture mask 5, the second shaping aperture mask 10, a detector 14, the first shaping aperture drive control circuit 31, and a rotation angle acquisition/instruction circuit 23. The electron gun 1 emits a charged particle beam 2. The first shaping aperture mask 5 is provided below the electron gun 1, and has a plurality of opening portions which include the first opening portion for rotation adjustment. The second shaping aperture mask 10 is provided below the first shaping aperture mask 5, and has a plurality of opening portions which include the second opening portion for rotation adjustment. The detector 14 detects an intensity distribution of the charged particle beams 2 emitted from the electron gun 1, the charged particle beams having passed through the first opening portion for rotation adjustment and the second opening portion for rotation adjustment and being in a plane which is substantially parallel to the second shaping aperture 10. The first shaping aperture drive control circuit 31 controls a relative rotation angle between the first shaping aperture mask 5 and the second shaping aperture mask 10 by rotating the first shaping aperture mask 5. The rotation angle acquisition/instruction circuit 23 changes a relative rotation angle between the first shaping aperture mask 5 and the second shaping aperture mask 10 a plurality of times by of the first shaping aperture drive control circuit 31, and acquires a relative rotation angle between the first shaping aperture mask 5 and the second shaping aperture mask 10, in which a deviation in relative rotation angle between the first shaping aperture mask 5 and the second shaping aperture mask 10 falls within a predetermined range, on the basis of a plurality of detection results obtained by detecting the charged particle beam 2 by the detector 14 for each rotation angle. Further, the rotation angle acquisition/instruction circuit 23 provides an instruction to the first shaping aperture drive control circuit 31 such that the relative rotation angle between the first shaping aperture mask 5 and the second shaping aperture mask 10 is to be the acquired rotation angle.

The charged particle beam drawing equipment according to the embodiment will be described below in more detail.

The charged particle beam 2 emitted from the electron gun 1 passes through a current limiting aperture mask 3. The charged particle beam 2 having passed through the current limit aperture mask 3 is adjusted in its current density by a condenser lens 4. The charged particle beam 2 whose current density has been adjusted uniformly illuminates the first shaping aperture mask 5.

FIG. 2 is a plan view showing an example of a layout of the first shaping aperture mask 5. The first shaping aperture mask 5 comprises an opening portion 41 used during general charged particle beam drawing and an opening portion (first opening portion for rotation adjustment) 42 used during adjustment of a rotation angle of the first shaping aperture mask 5 (hereinafter referred to as aperture rotation angle).

There is no need for the opening portion 42 to be provided at four corners of the first shaping aperture mask 5. The number of opening portion 42 may be one or more. The opening portion 42, for example, comprises a plurality of openings 43 arranged in one line. The dimensions of the plurality of openings 43 are equal to one another. The plurality of openings 43 are formed in a rectangular shape, and the plurality of openings 43 are arranged in a direction parallel to a narrow side of the rectangle. In FIG. 2, although the number of openings 43 is three, the number may be four or more. That is, the number of openings 43 can be variously selected in a range such that the strength of the first shaping aperture mask 5 is ensured.

The first shaping aperture drive control circuit 31 drives the first shaping aperture mask 5 and controls a position (posture) of the first shaping aperture mask 5 on an X-Y-$\theta$ coordinate axes. The first shaping aperture drive control circuit 31 controls the first shaping aperture mask 5 so as to be set at a position (posture) which corresponds to data (pattern data to be drawn) sent from a pattern data decoder 26.

Deflection of the charged particle beam passing through the first shaping aperture mask 5 is set by a voltage applied to the first shaping deflector 46 in the same manner as conventionally, and control of the voltage is carried out by a deflection control circuit 47.

The charged particle beam (image) having passed through the first shaping aperture mask 5 is focused on the second shaping aperture mask (CP aperture mask) 10 by a projecting lens 8.

FIG. 3 is a plan view showing an example of a layout of the second shaping aperture mask 10. The second shaping aperture mask 10 comprises an opening portion 44 used during general charged particle beam drawing and an opening portion (second opening portion for rotation adjustment)

45 used during adjustment of a rotation angle of the second shaping aperture mask 10 (hereinafter referred to as aperture rotation angle). The opening portion 44 comprises an opening pattern (CP pattern) which corresponds to a repetition pattern in a device. There is no need for the opening portion 45 to be provided at four corners of the second shaping aperture mask 10. The number of the opening portion 45 may be one or more. The opening portion 45, for example, comprises a plurality of rectangular openings 43 arranged in one line in the same manner as the opening portion 44.

An opening pattern of the opening portion 45 for adjustment in the second shaping aperture mask 10 may be identical or similar to that of the opening portion 42 for adjustment in the second shaping aperture mask 5. In the case where these opening patterns are similar to each other, it is desirable that the opening pattern of the opening portion 42 is of size considering a reduction rate (magnification) of beam size between the opening portion 42 and the opening portion 45. In particular, it is desirable that the pattern is equal to or smaller than 1.3 times of that of the opening portion 45 in the present embodiment.

As the opening patterns of the opening portions 42 and 45, for example, the opening patterns shown in FIG. 4 can be used in addition to those shown in FIG. 2. The dimensions of long side are reduced in order of openings 43a, 43b, and 43c. The dimensions of short side (widths) of the openings 43a, 43b, and 43c are equal to one another.

The second shaping aperture drive control circuit 32 drives the second shaping aperture mask 10 and controls a position (posture) of the second shaping aperture mask 10 on the X-Y-θ coordinate axes. The second shaping aperture drive control circuit 32 controls the second shaping aperture mask 10 so as to be set at a position (posture) which corresponds to the data (pattern data to be drawn) sent from the pattern data decoder 26.

A degree of an optical overlap between the first shaping aperture mask 5 and the second shaping aperture mask 10 is controlled by a CP selection deflector 9. The degree of optical overlap is determined by a CP (character pattern) contained in the second shaping aperture mask 10 selected by the CP selection deflector. The CP selector circuit 21 instructs the CP selection deflector 9 a CP to be selected.

An image caused by an optical overlap between the first shaping aperture mask 5 and the second shaping aperture mask 10 is reduced by a reduction lens 11. The thus reduced image is focused on a wafer (sample) 17 by an objective lens 13. The condenser lens 4, the projecting lens 8, the reduction lens 11, and the objective lens 13 are controlled by a lens controller circuit 19.

A position of the charged particle beam 2 on the face of the wafer 17 is set by a voltage applied to an objective deflector 12. The voltage is supplied from a beam deflector circuit 22. That is, the beam deflector circuit 22 applies to the objective deflector 12 a voltage which corresponds to the data (pattern data to be drawn) sent from the pattern data decoder 26. The deflection quantity of the charged particle beam 2 changes depending on the magnitude of the voltage applied to the objective deflector 12, and the position of the charged particle beam 2 on the face of the wafer 17 is set in accordance with this deflection quantity.

The charged particle beam 2 having passed through the second shaping aperture mask 10, the reduction lens 11, and the objective lens 13 is detected by the detector 14. This makes it possible to detect an intensity distribution of charged particle beams immediately before emitted onto the wafer 17, the charged particle beams having passed through the second shaping aperture mask 10 and being in a plane which is substantially parallel to the second shaping aperture mask 10. The detector 14 comprises, for example, a Faraday cup, and the intensity of the charged particle beam is obtained by, for example, a current.

In the present embodiment, an acquisition circuit which acquires a relative rotation angle between the first shaping aperture mask 5 and the second shaping aperture mask 10, in which a deviation in relative rotation angle between the first shaping aperture mask 5 and the second shaping aperture mask 10 falls into a predetermined range; and an instruction circuit which provides an instruction to the first shaping aperture drive control circuit 31 such that a relative rotation angle between the first shaping aperture mask 5 and the second shaping aperture mask 10 is to be the rotation angle acquired by the acquisition circuit are configured as one rotation angle acquisition/ instruction circuit 23, however, these circuits may be configured by respectively independent circuits.

The wafer 17 is set on a movable stage 16 together with a mark base 15. By moving the movable stage 16, the wafer 17, the Faraday cup 18, or the mark base 15 is selected. Movement of the movable stage 16 is controlled by a stage control circuit 24.

In addition, in the case of moving the position of the charged particle beam 2 on the wafer 17, the charged particle beam 2 is deflected onto a blanking aperture mask 6 by a blanking deflector 7 such that an unnecessary place on the wafer 17 is not exposed. In this manner, the charged particle beam 2 does not arrive on the face of the wafer 17, and thus, the unnecessary place on the wafer 17 is prevented from being exposed. A voltage applied to the blanking deflector 7 is supplied from the blanking deflector circuit 20. That is, the blanking deflector circuit 20 applies to the blanking deflector 7 a voltage corresponding to the data (pattern data to be drawn) sent from the pattern data decoder 26.

The data necessary for drawing is stored in a pattern data memory 25. The data read out from the pattern data memory 25 is decoded by the pattern data decoder 26. The data decoded in the pattern data decoder 26 is sent to a variety of circuits 19, 20, 21, 22, 23, and 24.

In the thus configured charged particle beam drawing equipment, there is a need for the CP selection deflector 9 and the objective deflector 12 to deflect the charged particle beam 2 with high precision and at a high speed. Thus, an electrostatic type deflector is used for these deflectors 9 and 12.

In addition, although not shown in FIG. 1, because of throughput and high precision, the objective deflector 12 comprises a main deflector and a subsidiary deflector, and further comprises a plurality of deflecting electrodes for minimizing a deflection aberration.

Figure 5:
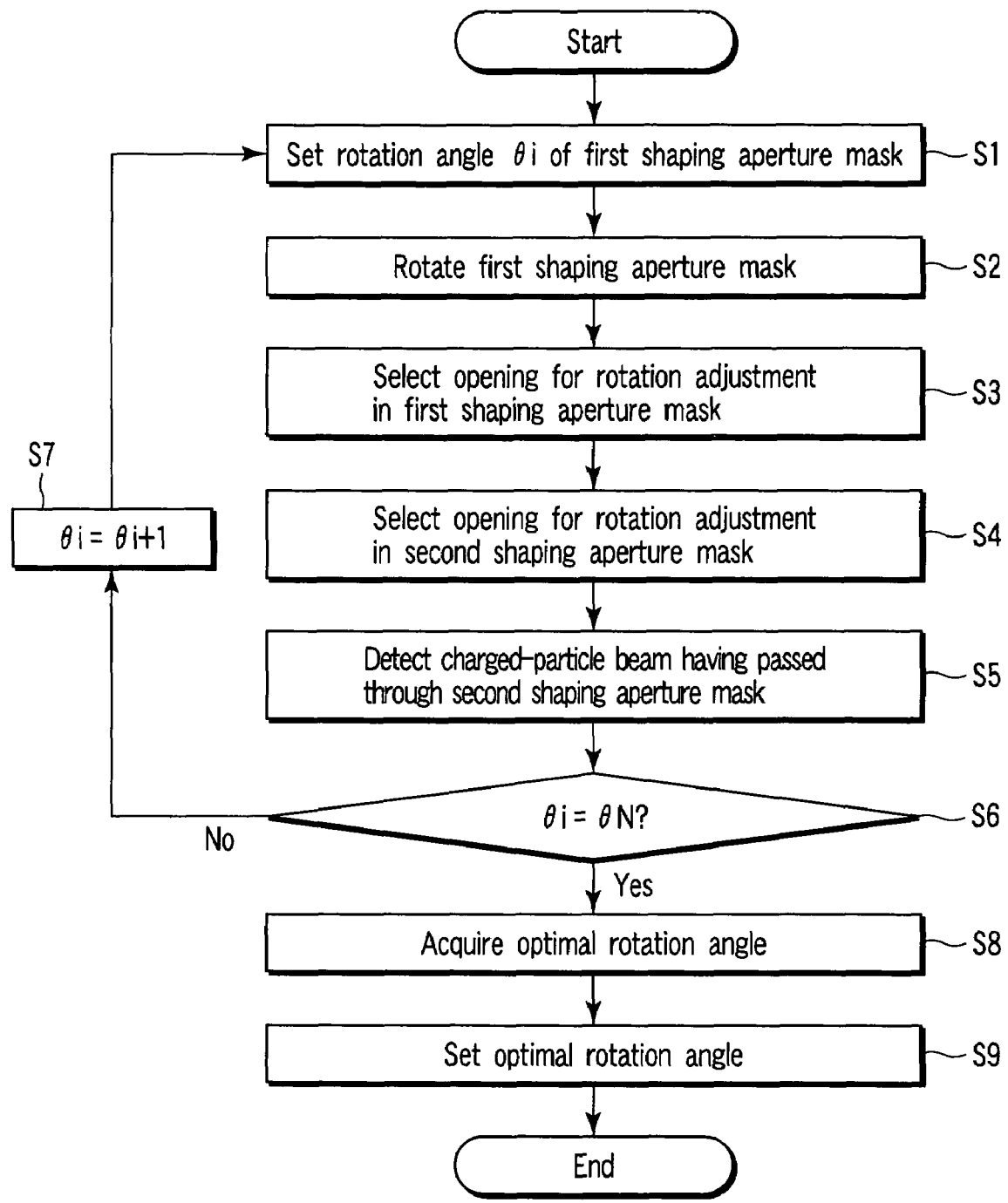
FIG. 5 is a flow chart showing a method of adjusting an aperture of the charged particle beam drawing equipment according to the embodiment of the invention.

Now, a method of adjusting an aperture rotation angle of the charged particle beam drawing equipment configured as described previously will be described with reference to the flow chart of FIG. 5.

A rotation angle θi (first, i=1) of the first shaping aperture mask 5 provided by the pattern data decoder 26 is set at the first shaping aperture drive control circuit 31 (step S1).

Next, by the first shaping aperture drive control circuit 31, the first shaping aperture mask 5 is rotated at a predetermined constant rotation angle such that the rotation angle of the first shaping aperture mask 5 becomes θ1 (step S2).

Next, one adjustment opening portion 42 contained in the first shaping aperture mask 5 is selected by the first shaping aperture drive control circuit 31 (step S3).

Next, the selected opening portion 42 of the first shaping aperture mask 5 is illuminated by the charged particle beam emitted from the electron gun 1, and one adjustment opening portion 45 in the second shaping aperture mask 10, which is selected by the CP selection deflector 9, is illuminated by the charged particle beam having passed through the selected opening portion 42 (step S4).

Next, an intensity distribution of the charged particle beams having passed through the opening portion 45 of the second shaping aperture mask 10 is detected by the detector 14 (step S5). The intensity distribution of the detected charged particle beams is sent to the rotation angle acquisition/instruction circuit 23.

Here, the steps S4 and S5 are repeated by predetermined times M, whereby the intensity distribution of the detected charged particle beams may be averaged. In this manner, the noise superimposed on the intensity distribution of the detected charged particle beams is reduced.

Then, it is judged whether or not the rotation angle θi has reached the rotation angle θN (step S6). In the case where the range of the rotation angle is ±10°, N is 3, 4, or 5.

In the case where the rotation angle θi does not reach the rotation angle θN, the angle is changed to θi=θi+1 (step S7), and the steps S1 to S5 are carried out. A series of these steps are carried out until the rotation angle θi reaches the rotation angle θN.

Next, based on the intensity distribution (signal intensity distribution) of N charged particle beams detected at N rotation angles θi (i=1–N), an optimal rotation angle is acquired by the rotation angle acquisition/instruction circuit 23 (Step S8). The optical rotation angle is acquired as follows.

FIG. 6 is a view showing a detection signal which corresponds to the intensity distribution of the charged particle beams detected at each rotation angle θi (i=1, 2, 3) in the case where the second shaping aperture mask 10 is fixed and the first shaping aperture mask 5 is rotated.

A charged particle beam is detected by a Faraday cup (detector 14) for instance. The Faraday cup (detector 14) is allocated at a position lower than the second shaping aperture mask 10. Alternatively, a charged particle beam is emitted onto a mark (mark base 15) provided on the stage 16, whereby the intensity of the reflection light or secondary electron may be detected.

In FIG. 6, the vertical axis indicates the intensity of the detection signal, and the horizontal axis indicates a position in a direction parallel to the short side of the rectangular opening contained in the opening (used for adjustment) 45, in a plane which is substantially parallel to the second shaping aperture mask 10.

As a rotation deviation between the first shaping aperture mask 5 and the second shaping aperture mask 10 becomes smaller, a peak of the detection signal becomes large, on the other hand, while a full width at half maximum (signal intensity) becomes small. Therefore, an optimal rotation angle can be acquired by making a search for a rotation angle (rotation angle θ1) which corresponds to the signal intensity distribution in which the intensity peak is maximal or the full width at half maximum is minimal, from among the detected plurality of detection signals.

In the case where a current flowing through the second shaping aperture mask 10 is used as a detection signal, the detection signal becomes small as the rotation deviation between the first shaping aperture mask 5 and the second shaping aperture mask 10 becomes small. Thus, an optimal rotation angle can be acquired by making a search for the rotation angle which corresponds to the signal intensity distribution in which the intensity peak is minimal from among the detected plurality of detection signals.

When the first shaping aperture mask 5 or the second shaping aperture mask 10 is rotated, an opening portion to be used is displaced if the opening portion to be used does not exist on a rotary shaft (on an optical axis). In such a case, the deflection of the charged particle beam passing through the aperture mask 5 or the aperture mask 10 is controlled by the deflection control circuit 47 or the CP selector circuit 21, whereby the irradiation position of the charged particle beam for the opening portion to be used may be set at a predetermined position.

In step S7, an optimal rotation angle may be acquired based on evaluation criteria (1) to (4) below.

(1) A detection signal having a minimum peak interval is selected from among a plurality of detection signals which correspond to the intensity distribution of the detected plurality of charged particle beams, and a rotation angle at the time of detection of the intensity distribution of the charged particle beams which correspond to the selected detection signal is determined as an optimal rotation angle.

(2) A primary differential signal having a maximum intensity is selected from among primary differentiation (dI/dX) signals of a plurality of detection signals which correspond to the intensity distribution of the detected plurality of charged particle beams, and a rotation angle at the time of detection of the intensity distribution of the charged particle beams which correspond to the selected primary differentiation signal is determined as an optimal rotation angle.

(3) The secondary differentiation signal having a minimum peak interval is selected from among secondary differentiation ($d^2I/dX^2$) signals of a plurality of detection signals which correspond to the intensity distribution of the detected plurality of charged particle beams, and a rotation angle at the time of detection of the intensity distribution of the charged particle beams which correspond to the selected secondary differentiation signal is determined as an optimal rotation angle.

(4) The secondary differentiation signal having a maximum absolute value with respect to a difference between a maximum signal intensity and a minimum signal intensity is selected from among secondary differentiation ($d^2I/dX^2$) signals of a plurality of detection signals which correspond to the intensity distribution of the detected plurality of charged particle beams, and a rotation angle at the time of detection of the intensity distribution of the charged particle beams which correspond to the selected secondary differentiation signal is determined as an optimal rotation angle.

The above evaluation criteria (1) to (4) are also applicable in the case where the intensity of a charged particle beam is evaluated based on any of a Faraday cup current, reflection light, The secondary electron, and a current flowing through the secondary shaping aperture mask 10.

Next, a rotation angle of the first shaping aperture mask 5 is controlled so as to produce the optimal rotation angle acquired in step S8. This control is carried out as follows. That is, an optimal rotation angle is sent from the rotation angle acquisition/instruction circuit 23 to the first shaping aperture drive control circuit 31, and the first shaping aperture drive control circuit 31 sets a rotation angle of the first shaping aperture mask 5 at the above optimal rotation angle.

Next, a method of manufacturing a semiconductor device of the present embodiment is explained.

At fist, a resist film is applied on a substrate including a semiconductor substrate. The substrate is, for example, a silicon substrate or SOI substrate.

Next, a pattern is drawn on the resist film using the charged particle beam drawing equipment of the present embodiment. Thereafter, a resist pattern is formed by developing the resist film.

Next, a pattern is formed on the substrate by etching the substrate using the resist pattern as a mask.

Here, in a case where a polycrystalline silicon film or metal film is an underlying layer of the resist pattern (top layer of the substrate), an electrode pattern, a wiring pattern, or like that is formed.

In a case where an insulating film is the underlying layer of the resist pattern, a fine contact hole pattern, gate insulating film, or like that is formed.

In a case where the silicon substrate film is the underlying layer of the resist pattern, an isolation trench (STI), or like that is formed.

The present invention is not limited to the above-described embodiment. For example, in the above embodiment, the second shaping aperture mask 10 is fixed, and the first shaping aperture mask 5 is rotated. However, it is permissible that the first shaping aperture mask 5 is fixed and the second shaping aperture mask 10 is rotated. Alternatively, the first shaping aperture mask 5 and the second shaping aperture mask 10 may be rotated.

In addition, while the embodiment has described the case where the number of aperture masks is two, three or more aperture masks may be used.

In addition, while the above embodiment has described the case of the charged particle beam drawing equipment, the present invention can be applied to any other charged particle beam drawing equipment such as an ion beam drawing equipment.

What is claimed is:

1. A charged particle beam drawing equipment comprising:
    a charged particle beam source configured to emit a charged particle beam;
    a first shaping aperture mask provided below the charged particle beam source and comprising a plurality of opening portions which include a first opening portion for rotation adjustment;
    a second shaping aperture mask provided below the first shaping aperture mask and comprising a plurality of opening portions which include a second opening portion for rotation adjustment;
    a detection section configured to detect an intensity distribution of charged particle beam, the intensity distribution being in a plane substantially parallel to the second shaping aperture mask, the charged particle beam being emitted from the charged particle beam source and passing through the first and second opening portions for rotation adjustment;
    a rotation angle control section configured to control a relative rotation angle between the first shaping aperture mask and the second shaping aperture mask by rotating the first shaping aperture mask or the second shaping aperture mask;
    an acquisition section configured to acquire a relative rotation angle between the first shaping aperture mask and the second shaping aperture mask such that a deviation in relative rotation angle between the first shaping aperture mask and the second shaping aperture mask falls within a predetermined range on the basis of a plurality of detection results obtained by changing the relative rotation angle between the first shaping aperture mask and the second shaping aperture mask a plurality of times by the rotation angle control section and by detecting the charged particle beam by the detection section for each rotation angle; and
    an instruction section configured to provide an instruction to the rotation angle control section such that the relative rotation angle between the first shaping aperture mask and the second shaping aperture mask is to be the acquired rotation angle.

2. The charged particle beam drawing equipment according to claim 1, wherein the first opening portion for rotation adjustment includes a plurality of openings.

3. The charged particle beam drawing equipment according to claim 2, wherein the plurality of opening portions of the first opening portion are formed in a rectangular shape.

4. The charged particle beam drawing equipment according to claim 2, wherein the first shaping aperture mask includes an opening portion for drawing.

5. The charged particle beam drawing equipment according to claim 2, wherein the second shaping aperture mask includes an opening portion for drawing.

6. The charged particle beam drawing equipment according to claim 5, wherein the second shaping aperture mask includes four second opening portions for rotation adjustment, and the four second opening portions for rotation adjustment are provided at four corners of the opening portion for drawing.

7. The charged particle beam drawing equipment according to claim 1, wherein the second opening portion for rotation adjustment includes a plurality of openings.

8. The charged particle beam drawing equipment according to claim 7, wherein the plurality of portions of the second opening portion for rotation adjustment is formed in a rectangular shape.

9. The charged particle beam drawing equipment according to claim 7, wherein the second opening portion for rotation adjustment includes a pattern which is identical or similar to the first opening portion for rotation adjustment.

10. A method of manufacturing a semiconductor device comprising:
    forming a resist film on a substrate including a semiconductor substrate;
    drawing a pattern on the substrate using a charged particle beam drawing equipment of claim 1;
    forming a resist pattern by developing the resist film; and
    forming a pattern on the substrate by etching the substrate using the resist pattern as a mask.

11. An aperture adjusting method for a charged particle beam drawing equipment,
    the charged particle beam drawing equipment comprising: a charged particle beam source configured to emit a charged particle beam; a first shaping aperture mask provided below the charged particle beam source and comprising a plurality of opening portions which include a first opening portion for rotation adjustment; and a second shaping aperture mask provided below the first shaping aperture mask and comprising a plurality of opening portions which include a second opening portion for rotation adjustment,
    the aperture adjusting method comprising:
    setting a relative rotation angle between the first shaping aperture mask and the second shaping aperture mask to one of a plurality of predetermined rotation angles;
    causing a charged particle beam emitted from the charged particle beam source to pass through the first and second opening portions for rotation adjustment;
    a detecting an intensity distribution of charged particle beam, the intensity distribution being in a plane substantially parallel to the second shaping aperture mask, the charged particle beam being emitted from the charged particle beam source and passing through the first and second opening portions for rotation adjustment;

with respect to a remaining rotation angle of the plurality of predetermined rotation angles, causing a charged particle beams emitted from the charged particle beam source to pass through the first and second opening portions for rotation adjustment, and detecting an intensity distribution of charged particle beam, the intensity distribution being in the plane substantially parallel to the second shaping aperture mask, the charged particle beam being emitted from the charged particle beam source and passing through the first and second opening portions for rotation adjustment;

acquiring the relative rotation angle between the first shaping aperture mask and the second shaping aperture mask such that a deviation in relative rotation angle between the first shaping aperture mask and the second shaping aperture mask falls within a predetermined range on the basis of the intensity distribution of the plurality of charged particle beams detected with respect to the plurality of predetermined rotation angles; and setting the relative rotation angle between the first shaping aperture mask and the second shaping aperture mask at the acquired rotation angle.

12. The aperture adjusting method according to claim 11, wherein the acquiring the rotation angle includes selecting a detection signal having a maximum signal intensity from among a plurality of detection signals which correspond to the intensity distribution of the plurality of charged particle beams; and determining a rotation angle obtained at the time of detection of the intensity distribution of the charged particle beams which correspond to the selected detection signal as the optimal rotation angle falling within the predetermined range.

13. The aperture adjusting method according to claim 11, wherein the acquiring the rotation angle includes selecting a detection signal having a minimum peak interval from among a plurality of detection signals which correspond to the intensity distribution of the plurality of charged particle beams; and determining a rotation angle obtained at the time of detection of the intensity distribution of the charged particle beams which correspond to the selected detection signal as the optimal rotation angle falling within the predetermined range.

14. The aperture adjusting method according to claim 11, wherein the acquiring the rotation angle includes selecting a primary differential signal having a maximum signal intensity from among primary differential signals of a plurality of detection signals which correspond to the intensity distribution of the plurality of charged particle beams; and determining a rotation angle obtained at the time of detection of the intensity distribution of the charged particle beams which correspond to the selected primary differentiation signal as the optimal rotation angle falling within the predetermined range.

15. The aperture adjusting method according to claim 11, wherein the acquiring the rotation angle includes selecting a secondary differential signal having a minimum peak interval from among secondary differential signals of a plurality of detection signals which correspond to the intensity distribution of the plurality of charged particle beams; and determining a rotation angle obtained at the time of detection of the intensity distribution of the charged particle beams which correspond to the selected secondary differentiation signal as the optimal rotation angle falling within the predetermined range.

16. The aperture adjusting method according to claim 11, wherein the acquiring the rotation angle includes selecting a secondary differentiation signal having a maximum absolute value with respect to a difference between a maximum signal intensity and a minimum signal intensity from among secondary differentiation signals of a plurality of detection signals which correspond to the intensity distribution of the plurality of charged particle beams; and determining a rotation angle obtained at the time of detection of the intensity distribution of the charged particle beams which correspond to the selected secondary differentiation signal as the optimal rotation angle falling within the predetermined range.

* * * * *

UNITED STATES PATENT AND TRADEMARK OFFICE
CERTIFICATE OF CORRECTION

| | | |
|---|---|---|
| PATENT NO. | : 7,242,014 B2 | Page 1 of 1 |
| APPLICATION NO. | : 11/172996 | |
| DATED | : July 10, 2007 | |
| INVENTOR(S) | : Ota et al. | |

It is certified that error appears in the above-identified patent and that said Letters Patent is hereby corrected as shown below:

Claim 11, column 11, line 7, change "beams" to --beam--.

Signed and Sealed this

Sixth Day of November, 2007

JON W. DUDAS
*Director of the United States Patent and Trademark Office*